United States Patent
Kirchev

(10) Patent No.: US 8,466,685 B2
(45) Date of Patent: Jun. 18, 2013

(54) METHOD OF ESTIMATION OF THE STATE OF CHARGE OF A BATTERY

(75) Inventor: Angel Zhivkov Kirchev, Aix-les-Bains (FR)

(73) Assignee: Commissariat a l'Energie Atomique et aux Energies Alternatives, Paris (FR)

(*) Notice: Subject to any disclaimer, the term of this patent is extended or adjusted under 35 U.S.C. 154(b) by 432 days.

(21) Appl. No.: 12/990,299

(22) PCT Filed: May 7, 2008

(86) PCT No.: PCT/IB2008/002393
§ 371 (c)(1),
(2), (4) Date: Oct. 29, 2010

(87) PCT Pub. No.: WO2009/136222
PCT Pub. Date: Nov. 12, 2009

(65) Prior Publication Data
US 2011/0043212 A1  Feb. 24, 2011

(51) Int. Cl.
*G01R 31/36* (2006.01)
*H02J 7/00* (2006.01)

(52) U.S. Cl.
USPC .......... 324/427; 324/426; 320/132; 320/133; 320/144; 320/149; 320/153; 323/907

(58) Field of Classification Search
USPC ........................................................ 324/427
See application file for complete search history.

(56) References Cited

U.S. PATENT DOCUMENTS

| 3,781,657 | A | | 12/1973 | Dennstedt | |
|---|---|---|---|---|---|
| 4,949,046 | A | | 8/1990 | Seyfang | |
| 5,304,433 | A | | 4/1994 | Cherng | |
| 5,614,804 | A | * | 3/1997 | Kayano et al. | 320/134 |
| 5,831,412 | A | * | 11/1998 | Morioka et al. | 320/106 |
| 5,994,877 | A | * | 11/1999 | Seri et al. | 320/132 |
| 6,198,253 | B1 | * | 3/2001 | Kurle et al. | 320/132 |
| 6,356,083 | B1 | * | 3/2002 | Ying | 324/426 |
| 2002/0196026 | A1 | * | 12/2002 | Kimura et al. | 324/426 |
| 2008/0254347 | A1 | * | 10/2008 | Palladino | 429/90 |
| 2009/0104510 | A1 | * | 4/2009 | Fulop et al. | 429/50 |

FOREIGN PATENT DOCUMENTS

| EP | 0 595 466 A1 | 5/1994 |
|---|---|---|
| EP | FR 2 737 923 A1 | 2/1997 |

OTHER PUBLICATIONS

Brecht et al., "Reference Electrode's Use in the Analysis of Battery Performance and Operation," 11th Annual Battery Conference on Applications and Advances, Long Beach, CA, Jan. 9, 1996, pp. 261-266.

International Search Report issued in Application No. PCT/IB2008/002393; Dated Mar. 5, 2009.

* cited by examiner

Primary Examiner — Yalkew Fantu
(74) Attorney, Agent, or Firm — Oliff & Berridge, PLC

(57) ABSTRACT

The method includes the simultaneous measurement of the current I, of the positive plate potential $V_+$, and of the temperature T at the positive terminal of the battery, the determination of a temperature compensated value $V_{c+}$ of the positive plate potential and the use of the temperature compensated value $V_{c+}$ for estimation of the state of charge. This method is more particularly used for estimation of the state of charge of an alkaline battery having a NiOOH positive plate.

6 Claims, 3 Drawing Sheets

METHOD OF ESTIMATION OF THE STATE OF CHARGE OF A BATTERY

BACKGROUND OF THE INVENTION

The invention relates to a method of estimation of the state of charge of an alkaline battery having a predetermined nominal battery capacity and comprising an integrated reference and a NiOOH positive plate, said method comprising:
measuring the voltage between said positive plate and said reference electrode, said voltage being representative of the positive plate potential V+,
and estimating the state of charge as a function of said positive plate potential and of the battery current.

STATE OF THE ART

The state of charge (SOC) of a battery usually refers to the electrochemical capacity (in Ah or in % of a reference capacity value) of the battery available by a discharge at predetermined conditions as regards the discharge current, temperature, voltage limit, etc. The estimation and indication of the SOC is an important requirement in each system using electrochemical storage of energy.

The SOC can also be estimated on the basis of simple measurements of the voltage at the terminals of the battery and of the current flow, for example as disclosed in U.S. Pat. No. 4,949,046. A current sensor senses current flow into and out of the battery and provides an output indicative of both the magnitude and direction of the current flow. A voltage sensor indicates if the battery is fully charged or fully discharged. The current and voltage sensors, as well as a temperature sensor are connected to a microprocessor. Microprocessor uses look-up tables stored in a memory for determining the state of charge of the battery. The look-up table is limited to a given type of battery because it takes into account the battery voltage and not the positive plate potential.

However, the use of the voltage to estimate the state of charge of a battery leads to errors due to the incertitude of the charge efficiency. This is illustrated in FIG. 1 showing the evolution of the positive plate potential $V_+$ (curve A) and of the negative plate potential $V_-$ (curve B) according to time, both during discharge and charge of a 45 Ah Ni—Cd cell with pocket plate Ni-electrodes for solar applications.

U.S. Pat. No. 3,781,657 discloses a method for determining and indicating the state of charge of a nickel-cadmium battery having a positive nickel-hydroxide electrode and a negative cadmium electrode. The battery also comprises a reference electrode and the potential of the positive electrode with respect to the reference electrode is measured for a predetermined fixed discharge current. The variation in the negative direction of this potential is an indication of the state of charge of the battery. This determination of the state of charge is obtained only during discharge of a fully charged battery.

OBJECT OF THE INVENTION

The object of the invention is to overcome the drawbacks of the known methods for estimation of the state of charge of an alkaline battery and, more particularly, to increase the accuracy of this estimation.

According to the invention, this object is achieved by a method according to the appended claims and, more particularly by the fact that the method comprises:

simultaneous measuring the battery current I, the positive plate potential $V_+$ and the temperature T at a terminal of the battery,
determinating of a temperature compensated value $V_{c+}$ of the positive plate potential as a function of the measured values of the positive plate potential $V_+$, of the current I, of the temperature T and of the nominal battery capacity $C_n$,
said estimation of the state of charge taking into account the temperature compensated value $V_{c+}$ of the positive plate potential.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
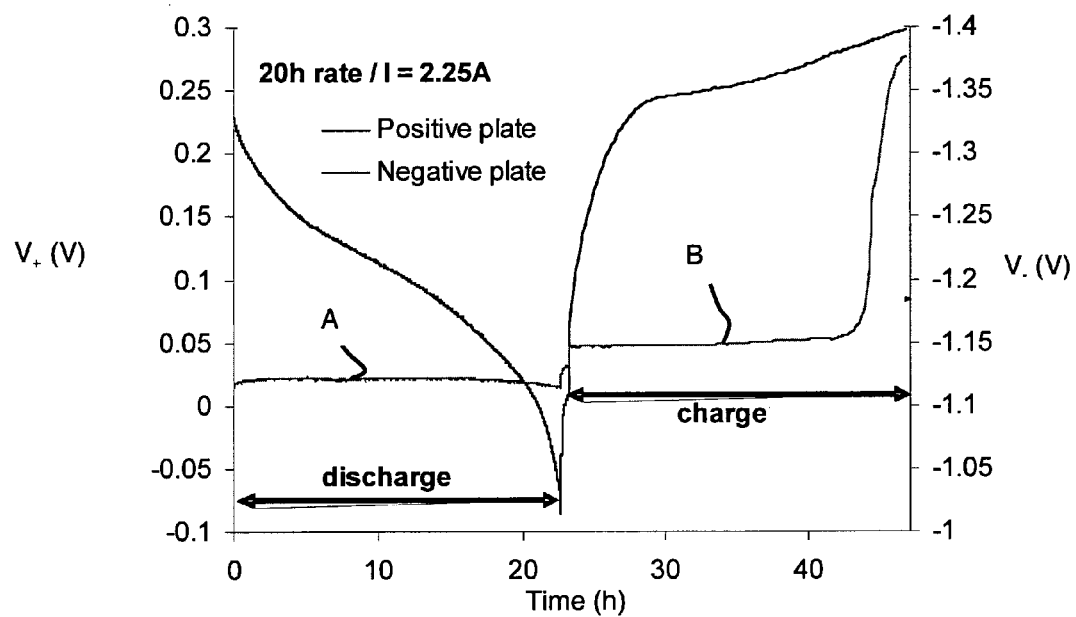
FIG. 1 shows the evolution of the positive plate potential $(V_+)$ and of the negative plate potential $(V_-)$ during a discharge and a consecutive charge.

The alkaline battery has a predetermined nominal battery capacity Cn and comprises a reference electrode, preferably an integrated liquid junction reference electrode, a NIOOH positive plate and a negative plate which may be made in different materials like metal hybrid, Cd, Zn, Fe, etc.

The battery can comprise one or more cells connected to each other, the integrated reference electrode being preferably as closer as possible from the positive plate.

The state of charge (SOC) estimation uses the correlation existing between the SOC of the positive plate, the positive plate potential and the current flowing trough the battery.

The method of estimation of the state of charge of an alkaline battery comprises the measurement of the voltage between said positive plate and said reference electrode. The measured voltage is representative of the positive plate potential $V_+$, which is equal to the voltage difference between the positive plate and the integrated reference electrode. The reference electrode may be of any kind suitable for long term measurements in alkaline solutions—Ag/Ag$_2$O, Hg/HgO, etc. The estimation of the SOC is function of said positive plate potential $V_+$ and of the battery current I. First, the positive plate potential $V_+$, the temperature T at a terminal of the battery and the current I are measured simultaneously. Then, a temperature compensated value $V_{c+}$ of the positive plate potential is determined as a function of the measured values of the positive plate potential $V_+$, of the current I, of the temperature T and of the nominal battery capacity $C_n$. Finally, the estimation of the state of charge takes into account the temperature compensated value $V_{c+}$ of the positive plate potential The temperature compensated value $V_{c+}$ of the positive plate potential is preferably given by:

$$V_{c+} = V_+ + (T-T_0) \times k_{tsoc} \quad (1)$$

wherein $T_0$ is a predetermined reference temperature value, $k_{tsoc}$ is a temperature coefficient of the positive plate potential and T is the temperature measured at the terminal of the battery.

The temperature coefficient $k_{tsoc}$ is function of the charge or discharge rate. The rate is expressed in hours and corresponds to the ratio $C_n/I$ between the nominal capacity battery Cn (in Ah) and the measured current value I.

The different values of $k_{tsoc}$ corresponding to the different charge and discharge rates are determined during a previous calibration procedure and these values may be stored in a corresponding look-up table. After the determination of the temperature coefficient, the compensated value $V_{c+}$ of the positive plate potential can thus be easily determined by using equation (1).

Then, the state of charge SOC($V_{c+}$,rate) can be estimated in taking into account the $V_{c+}$ value instead of the $V_+$ value in a function SOC($V_+$,rate) previously obtained during the calibration procedure. This function SOC($V_+$,rate) can be established under the form of a plurality of values stored in a first look-up table.

Figure 2:
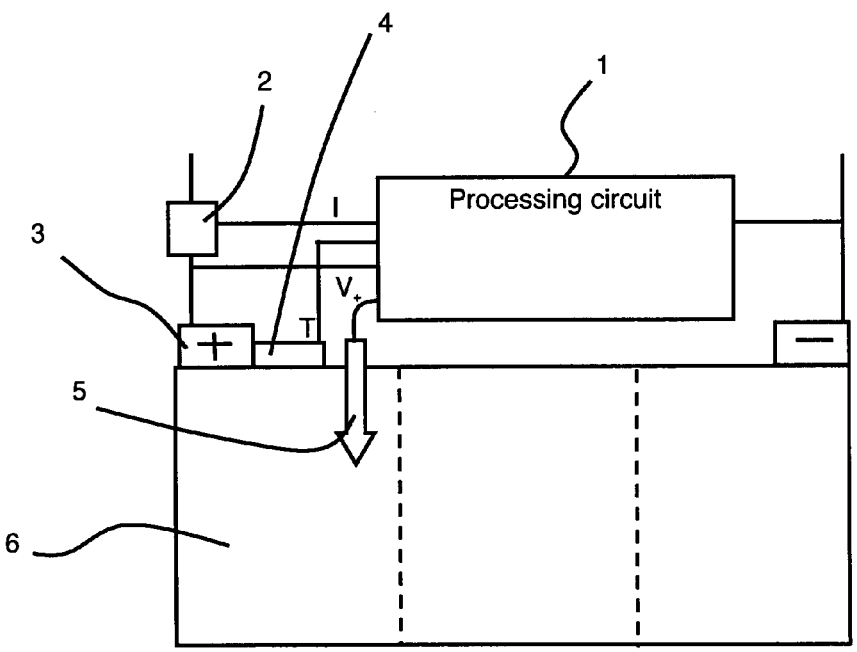
FIG. 2 illustrates schematically a battery with a management unit.

As shown in FIG. 2, the battery preferably comprises an autonomous battery management unit. The management unit comprises a processing circuit 1 connected to a current sensor 2 (connected to the positive battery terminal 3 on FIG. 2), to a temperature sensor 4, in contact with one of the battery terminals (the positive terminal 3 in FIG. 2) for measuring the temperature of said battery terminal. The processing circuit 2 is further connected to the reference electrode 5 and to the positive terminal 3 for measuring the voltage difference between these two points, i.e. the positive plate potential V. The current sensor 2 can be a shunt or amperemeter connected in series with the positive battery terminal 3. The processing circuit 1 preferably comprises a memory (not represented) in which the different look-up tables and the known nominal capacity $C_n$ of the battery are stored. The battery management system can be power supplied by its own source of energy or, as represented in FIG. 2, by the battery itself by means of power supply inputs respectively connected to the positive and negative terminals of the battery. As shown in FIG. 2, when the battery comprises a plurality of cells in series, the reference electrode 5 is preferably located in an end cell 6 which is near the positive battery terminal 3. The processing circuit preferably further comprises a display unit (not shown) for displaying the estimated SOC value.

The above mentioned calibration procedure preferably proceeds in two stages. In a first stage, the function SOC($V_+$, rate) is established, while in a second stage the relation $k_{tsoc}$ (rate) is determined. The calibration procedure is performed at the reference temperature $T_0$. These functions SOC and $k_{tsoc}$ can be obtained by any known calibration procedure, and the results of this calibration procedure are preferably stored in corresponding first and second look-up tables the memory of the processing circuit 1.

The first look-up table contains different SOC values as function of the rate and of the positive plate potential $V_+$, this first look-up table is preferably divided into two parts. A first part contains, in a first column, SOC values obtained, between 1 and 99%, during the calibration procedure by discharge of the battery at different discharge rates and corresponding to the different positive plate potential values, respectively 5, 10, 20, 40 and 60 h.

The following table 1 illustrates the first part of the first look-up table:

TABLE 1

| | Discharge Rate (h) | | | | |
|---|---|---|---|---|---|
| | 5 | 10 | 20 | 40 | 60 |
| SOC$_{dsch}$ (%) | Positive plate potential V$_+$ (V) | | | | |
| 99 | 0.192 | 0.187 | 0.219 | 0.259 | 0.243 |
| 98 | 0.183 | 0.178 | 0.212 | 0.250 | 0.236 |
| 97 | 0.177 | 0.173 | 0.206 | 0.244 | 0.230 |
| 96 | 0.170 | 0.166 | 0.201 | 0.237 | 0.225 |
| 95 | 0.166 | 0.163 | 0.196 | 0.232 | 0.220 |
| 90 | 0.145 | 0.144 | 0.177 | 0.207 | 0.199 |
| 80 | 0.115 | 0.123 | 0.149 | 0.173 | 0.170 |
| 70 | 0.097 | 0.107 | 0.132 | 0.151 | 0.151 |
| 60 | 0.080 | 0.094 | 0.120 | 0.133 | 0.135 |
| 50 | 0.066 | 0.079 | 0.104 | 0.117 | 0.121 |
| 40 | 0.049 | 0.063 | 0.087 | 0.100 | 0.104 |
| 30 | 0.029 | 0.042 | 0.067 | 0.075 | 0.083 |
| 20 | 0.006 | 0.016 | 0.042 | 0.044 | 0.059 |
| 10 | −0.024 | −0.015 | 0.012 | 0.004 | 0.026 |
| 5 | −0.047 | −0.039 | −0.016 | −0.028 | −0.011 |
| 4 | −0.052 | −0.045 | −0.023 | −0.036 | −0.020 |
| 3 | −0.058 | −0.052 | −0.034 | −0.044 | −0.028 |
| 2 | −0.063 | −0.058 | −0.046 | −0.054 | −0.039 |
| 1 | −0.069 | −0.067 | −0.060 | −0.066 | −0.050 |

The second part of the first look-up table illustrated below as table 2, represents SOC values SOC$_{ch}$ obtained during the calibration procedure by charge of the battery at different charge rate (respectively 5, 10, 20, 40 and 60 h) (FIG. 4) and corresponding to different positive plate potential values:

TABLE 2

| | Charge Rate (h) | | | | |
|---|---|---|---|---|---|
| | 5 | 10 | 20 | 40 | 60 |
| SOC$_{ch}$ (%) | Positive plate potential V$_+$ (V) | | | | |
| 99 | 0.344 | 0.313 | 0.296 | 0.282 | 0.265 |
| 98 | 0.344 | 0.313 | 0.294 | 0.281 | 0.264 |
| 97 | 0.343 | 0.313 | 0.294 | 0.280 | 0.263 |
| 96 | 0.343 | 0.312 | 0.292 | 0.279 | 0.262 |
| 95 | 0.342 | 0.312 | 0.290 | 0.279 | 0.262 |
| 90 | 0.340 | 0.306 | 0.285 | 0.272 | 0.261 |
| 80 | 0.339 | 0.300 | 0.277 | 0.265 | 0.251 |
| 70 | 0.338 | 0.288 | 0.267 | 0.255 | 0.245 |
| 60 | 0.332 | 0.278 | 0.259 | 0.248 | 0.239 |
| 50 | 0.317 | 0.269 | 0.252 | 0.241 | 0.233 |
| 40 | 0.302 | 0.263 | 0.248 | 0.236 | 0.229 |
| 30 | 0.293 | 0.259 | 0.244 | 0.232 | 0.225 |
| 20 | 0.283 | 0.249 | 0.232 | 0.218 | 0.210 |
| 10 | 0.256 | 0.209 | 0.185 | 0.165 | 0.161 |
| 5 | 0.231 | 0.170 | 0.141 | 0.118 | 0.112 |
| 4 | 0.225 | 0.161 | 0.129 | 0.107 | 0.099 |
| 3 | 0.217 | 0.149 | 0.116 | 0.093 | 0.085 |
| 2 | 0.209 | 0.136 | 0.101 | 0.075 | 0.067 |
| 1 | 0.199 | 0.120 | 0.081 | 0.052 | 0.043 |

In order to build the first and the second part of the first look-up table, the battery is subject to several charge/discharge cycles. Each cycle can, for example, comprise a discharge with a constant predetermined current, followed by 30 min open circuit stay and a constant current charge with the same rate until electric energy amount, in Ah, exceeds by 45% the electric energy amount removed during the last discharge.

In tables 1 and 2, the used charge/discharge rates correspond to the following values: 60 h, 40 h, 20 h, 10 h and 5 h. In general this method gives good results up to a rate of charge going down to 4 h. For SOC estimation during the discharge the method can provide adequate values at much lower discharge rates (rapid discharge), like 0.5-1 h, due to the fact that during the discharge there is no parasitic reactions like gassing, corrosion, and so on.

In table 1, the SOC's values SOC$_{dsch}$ have been calculated for each discharge rate by integration of the discharge current during the time interval necessary to obtain a given positive plate potential $V_+$ and normalization by the discharge capacity $C_d$ of the battery $$SOC_{dsch} = \frac{100}{Cd} \int_0^t I \, dt \qquad (2)$$

Thus, during the calibration process, the current I and the positive plate potential $V_{30}$ are measured and the corresponding SOC value $SOC_{dsch}$ is calculated according to equation (2), wherein $C_d$ is obtained by calibration and corresponds to the product of the measured current I and of the discharge rate.

Figure 3:
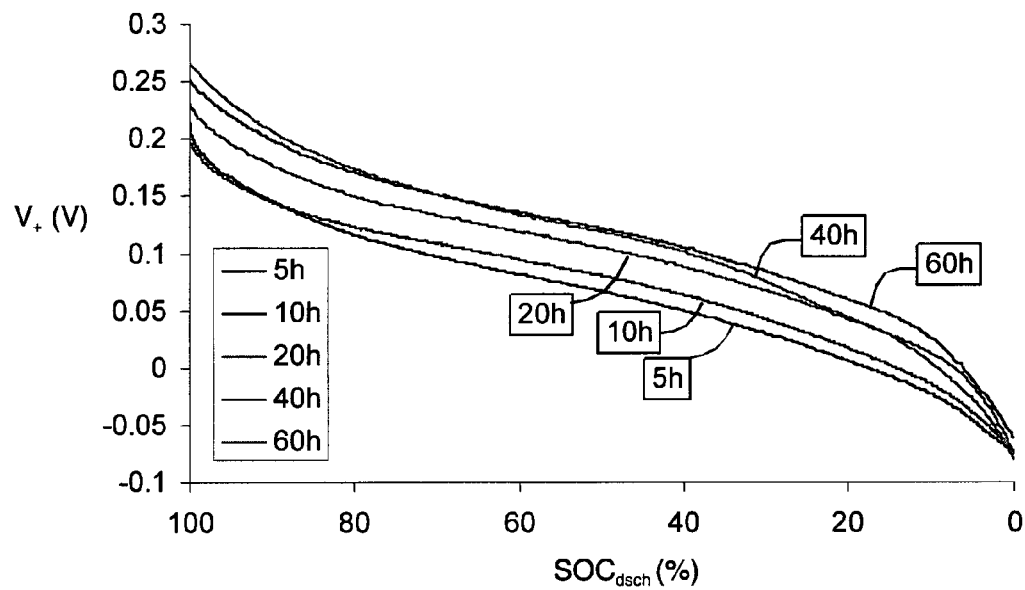
FIGS. 3 and 4 illustrates the variation of the positive plate potential $(V_+)$ versus the state of charge (SOC) respectively at different discharge and charge rates.

FIG. 3 illustrates the corresponding measured variation of the positive plate potential $V_+$ versus the calculated values of the SOC for various values of the discharge rate.

As an example, the experimental curves of FIG. 3 have been obtained with a 45 Ah Ni—Cd cell, usually used for solar applications, with pocket plate type of positive plates. The used reference electrode is an Ag/Ag$_2$O electrode filled with KOH having a specific gravity 1.21 g/ml (22.38 wt %, 4.83M), which is considered to be close enough to the electrolyte in the Ni—Cd cell. The represented data are illustrative and should not limit the invention to this particular example.

The first part of the first look-up table representative of the function SOC($V_+$,rate) can be derived from the curves shown in FIG. 3.

The selected values of SOC have been established according to equation (2), with minimum accuracy of +/−0.1%. The selected SOC values in Table 1 represent a minimum data set, by which a whole curve of $V_+$(SOC) can be generated by cubic spline interpolation with a fair accuracy. It can be shown that the difference between a spline generated $V_+$(SOC) curve and an experimental curve is negligible.

This minimum data set may be required if the construction of the look-up table is less automated, in order to decrease the cost of the calibration procedure.

The next step may comprise a numerical expansion of the obtained look-up table: first each discharge curve of $V_+$(SOC) is expanded from SOC=1 to 99% with steps of 1% by interpolation with cubic splines. The number of the rows of the look-up table thus increases automatically about 5 times, which corresponds to an increase of the virtual accuracy to about +/−0.5%.

Figure 5:
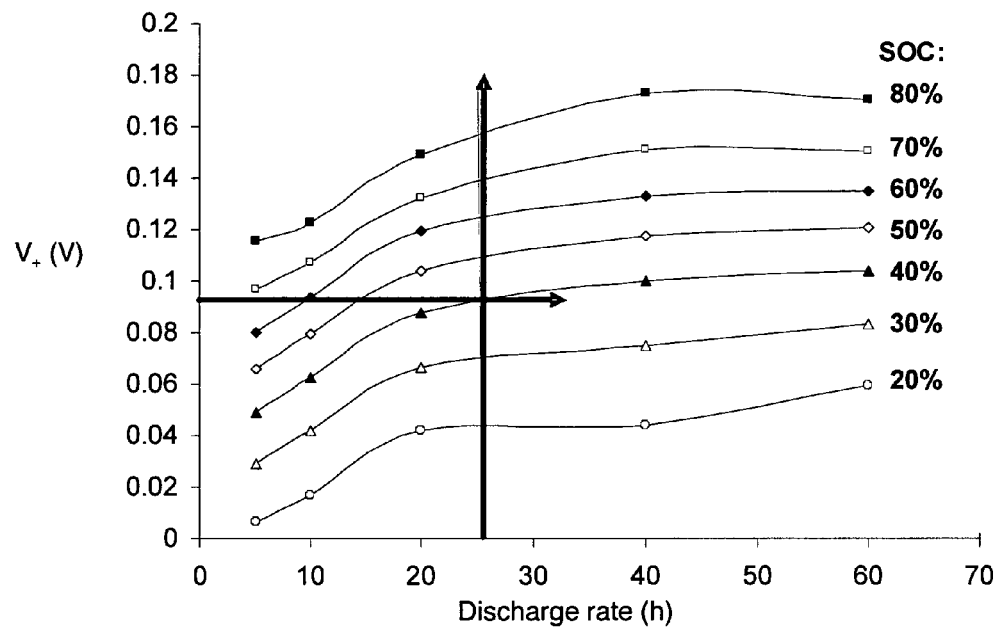
FIG. 5 illustrates the variation of the positive plate potential $(V_+)$ versus the discharge rate, for several state of charge values.

The construction of the discharge part of the first look-up table may also comprise an expansion of the number of columns. On the basis of $V_+$(rate) values corresponding to each SOC value, the number of columns can be increased a few times by cubic spline interpolation, with a rate step of 0.5 h. The corresponding $V_+$(rate) curves for several SOC values are shown in FIG. 5.

Figure 6:
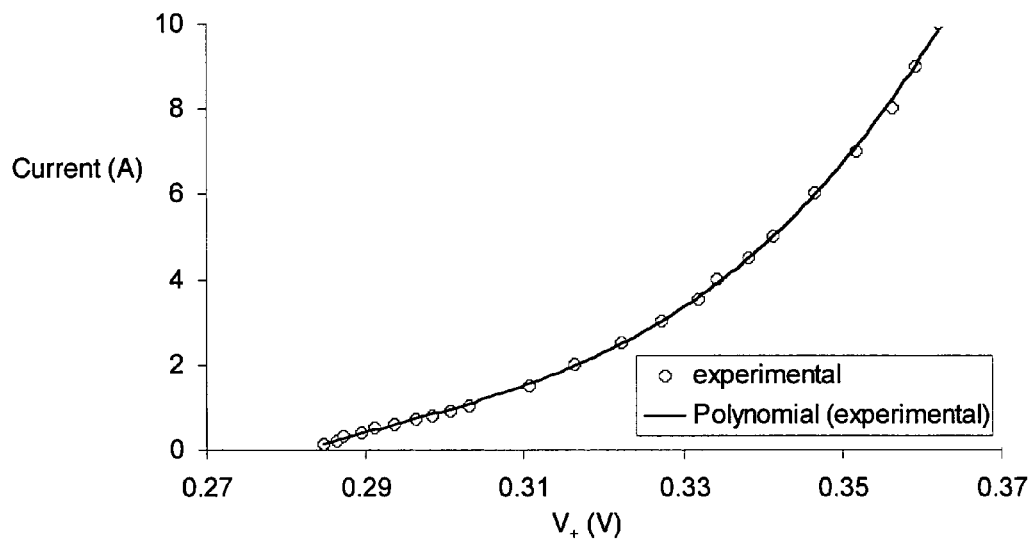
FIG. 6 illustrates the variation of the oxygen evolution current versus the positive plate potential at 22° C.

The second part of the first look-up table is built in a similar way during the charge cycles of the calibration process by integration of the charge current and normalization by $C_d$. However it is advisable to take into account the inefficiency of the adverse effect of oxygen evolution within an alkaline battery. The oxygen evolution produces a parasite current, which occurs during the charge of the battery. Indeed, during charge there is two type of current, a charge current $I_{ch}$ given by Ni(OH)$_2 \rightarrow$ NiOOH+e$^-$+H$^+$ and a parasite current $I_{O2}$ depending of O$_2$ gas given by 4OH$^- \rightarrow$ 2H$_2$O+O$_2$+4 e$^-$, the measured current I corresponding to the sum of theses currents. It is therefore advisable to correct the measured current value in estimating the dependence of the oxygen evolution current $I_{O2}$ on the positive plate potential $V_+$. This can be done only when the battery is fully charged. Indeed, at this moment all the injected current is consumed for oxygen evolution on the positive plate and an experimental curve $I_{O2}(V_+)$ can be obtained at a predetermined temperature, as shown, for example, in FIG. 6 at 22° C. Each point is measured after one hour of constant current overcharge in current increasing direction, after three voltammetric cycles.

Then the curve $I_{O2}(V_+)$ can be interpolated by known methods using an empiric equation. The best choice for the empiric equation is a polynomial of the third order:

$$I_{O2} = a_0 + a_1 V_+ + a_2 V_+^2 + a_3 V_+^3 \qquad (3)$$

The coefficients $a_0$, $a_1$, $a_2$ and $a_3$ can be found by any known analysis methods, such as by linear regression.

The obtained polynomial function $I_{O2}(V_+)$ can then be used to calculate corrected values $SOC_{ch}$ of the SOC during the charge calibration process using the following relation:

$$SOC_{ch} = \frac{100}{Cd} \int_0^t [I - I_{O2}(V_+)] \, dt \qquad (4)$$

Then, the construction of the second part of the first look-up table follows the same procedure as for the first part.

Figure 4:
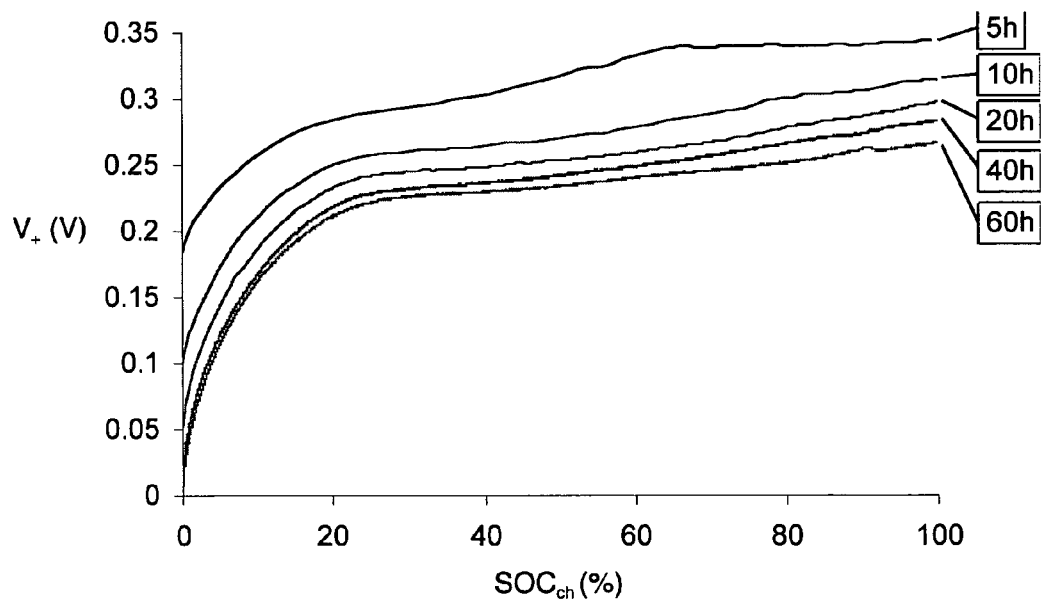

The second part of the first look-up table representative of the function SOC($V_+$,rate) can be derived from the curves shown in FIG. 4.

The second stage in the calibration procedure is the determination of the relation between temperature compensation coefficient $k_{tsoc}$ and the rate, which can be stored in a second look-up table. In a preferred embodiment, the procedure used for the construction of the first look-up table is repeated at least at two additional temperatures, one higher than the reference temperature $T_0$ value, for example $T_1=50°$ C., and one below the reference temperature, for example $T_2=0°$ C. The above-mentioned procedures respectively provide the function $V_+$(SOC, $T_1$) and $V_+$(SOC, $T_2$) for a plurality of charge and discharge rates.

As example, for each charge and discharge rate a first coefficient $k_T$ is calculated as the slope of the positive plate potential $V_+$ vs. temperatures $T_0$, $T_1$ and $T_2$, at n different values, for example for SOC=20, 40, 60 and 80%, where $$k_t(SOC) = \frac{V_+(SOC, T_2) - V_+(SOC, T_1)}{T_2 - T_1} \qquad (5)$$

Then, for each charge and discharge rate, the average $k_{tsoc}$ is calculated $$k_{tsoc} = \frac{1}{n} \sum_1^n k_t(SOC),$$

in the above example n=4. The look-up table of $k_{tsoc}$ vs. rate can be extended by cubic spline interpolation with the same rate step value as for 1$^{st}$ look-up table.

In order to obtain SOC results with the best accuracy, the calibration should theoretically be performed individually for each type, size and design of alkaline battery. However, the calibration values contained in a same look-up table can in fact be used for the estimation of the state of charge of different types of alkaline batteries (Ni—Cd, Ni-MH, Ni—Zn, Ni—Fe), with various dimensions, provided that they have the same or a similar type of positive plate, for example a NiOOH electrode (pocket-plate, sintered, etc.), and that the calibration data has been obtained from a calibration procedure performed with the chosen type of NiOOH electrode. Furthermore the electrolyte composition of the reference electrode should be identical to the electrolyte composition of the completely charged, or discharged, battery or cell in which the reference electrode is located in order to eliminate the influence of the junction potential between the reference electrode and the battery.

The invention can be applied in different energy systems where the charge, current is limited to about $C_n/5$-$C_n/4$, for example in the photovoltaic systems with integrated energy storage where the charge current or power are limited by the area of the PV module and the maximum value of solar irradiation.

The invention claimed is:

1. A method of estimation of a state of charge of an alkaline battery having a predetermined nominal battery capacity $C_n$, and comprising a reference electrode and a NiOOH positive plate, said method comprising: measuring a voltage between said positive plate and said reference electrode, said voltage being representative of the positive plate potential $V_+$, and estimating the state of charge (SOC) as a function of said positive plate potential and of a battery current, wherein the method comprises: simultaneous measuring the battery current I, the positive plate potential $V_+$ and a temperature T at a terminal of the battery, determining a temperature compensated value $V_{c+}$ of the positive plate potential as a function of the measured values of the positive plate potential $V_+$, of the current I, of the temperature T and of the nominal battery capacity $C_n$, said estimation of the state of charge taking into account the temperature compensated value $V_{c+}$ of the positive plate potential, wherein said determination of the temperature compensated value $V_{c+}$ of the positive plate potential comprises the following steps: determining a temperature coefficient $k_{tsoc}$ corresponding to at least one charge or discharge rate, calculating the compensated value $V_{c+}$ of the positive plate potential according to $V_{c+} = V_+ + (T - T_0) \times k_{tsoc}$, wherein $T_0$ is a predetermined reference temperature.

2. The method according to claim 1, wherein the estimation of the state of charge is obtained by means of a first look-up table previously established during a calibration procedure and giving the correspondence between the SOC and the positive plate potential for various charge and discharge rates.

3. The method according to claim 2, wherein the calibration procedure is performed at the reference temperature $T_0$.

4. The method according to claim 2, wherein, for a given charge or discharge rate, the state of charge values of the first look-up table are calculated by integration of the charge or discharge current during a time interval necessary to obtain a predetermined $V_+$ value and to a normalization by the discharge battery capacity $C_d$.

5. The method according to claim 4, wherein the measured charge current values are corrected to take into account the influence of oxygen evolution on the positive plate potential.

6. The method according to claim 1, wherein said temperature coefficient is determined on the basis of an estimation of the state of charge during calibration procedures at different temperatures ($T_1$, $T_2$).

* * * * *